(12) United States Patent
Lee et al.

(10) Patent No.: US 7,387,910 B2
(45) Date of Patent: Jun. 17, 2008

(54) METHOD OF BONDING SOLDER PADS OF FLIP-CHIP PACKAGE

(75) Inventors: Woong-Sun Lee, Daejeon (KR); Jin Yu, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 285 days.

(21) Appl. No.: 11/403,538

(22) Filed: Apr. 13, 2006

(65) Prior Publication Data

US 2006/0258049 A1    Nov. 16, 2006

(30) Foreign Application Priority Data

Apr. 15, 2005    (KR) ............... 10-2005-0031582

(51) Int. Cl.
| | |
|---|---|
| *H01L 21/50* | (2006.01) |
| *H01L 21/48* | (2006.01) |
| *H01L 21/44* | (2006.01) |
| *H01L 23/52* | (2006.01) |
| *H01L 23/48* | (2006.01) |
| *H01L 23/40* | (2006.01) |

(52) U.S. Cl. ............... 438/108; 438/613; 438/612; 257/780; 257/778; 257/779; 257/738; 257/E23.021; 257/E23.023

(58) Field of Classification Search ............... 438/108, 438/613, 612; 257/780, 778, 779, 738, E23.021, 257/E23.023
See application file for complete search history.

(56) References Cited

U.S. PATENT DOCUMENTS

| | | | | |
|---|---|---|---|---|
| 5,897,336 A | * | 4/1999 | Brouillette et al. | ......... 438/108 |
| 6,127,253 A | * | 10/2000 | Roldan et al. | ............. 438/612 |
| 6,550,665 B1 | * | 4/2003 | Parrish et al. | ......... 228/180.22 |

\* cited by examiner

*Primary Examiner*—Luan Thai
(74) *Attorney, Agent, or Firm*—Fish & Richardson P.C.

(57) ABSTRACT

Disclosed herein is a method of bonding solder pads of a flip-chip package. This invention relates to a method of bonding solder pads having different sizes to each other, when a bonding operation is executed between a chip and a PCB, between chips, or between PCBs. On a side having a larger solder pad, a general solder ball is used. Conversely, on a side having a smaller solder pad, a solder ball having a core is used. The core serves to maintain a predetermined interval between the chip and the PCB or between the chips, after the bonding operation has been completed. The solder bonded parts are aligned with each other so as to perform a final bonding operation. In a conventional flip-chip package, solder pads provided on a bonded part must have the same or similar size. According to this invention, even if the size difference between the solder pads is large, bonding is possible, thus ensuring electrical and mechanical reliability.

9 Claims, 5 Drawing Sheets

(A)

(B)

(A)

(B)

METHOD OF BONDING SOLDER PADS OF FLIP-CHIP PACKAGE

BACKGROUND OF THE INVENTION

1. Field of the Invention

The present invention relates generally to a method of bonding solder pads of a flip-chip package, and more particularly to a method of bonding solder pads of a flip-chip package, when solder pads provided at solder bonded parts have different sizes in the flip-chip package, which is one kind of electronic package. This invention is adapted to all packages in which solder pads provided at bonded parts have different sizes, in a packaging field which requires direct bonding between a chip and a printed circuit board (PCB) or between chips, such as a system-in-package as well as the flip-chip package.

2. Description of the Related Art

In a conventional flip-chip package, solder pads of a chip and a PCB must have the same or similar size so as to increase a bonding effect at a part bonded using solder, as shown in FIGS. 1 and 2A.

Referring to FIG. 1, reference numeral 1 denotes a chip, reference numeral 2 denotes a PCB, reference numeral 4 denotes a metal wetting layer, reference numeral 5 denotes general solder having no core, reference numeral 6 denotes a passivation layer of a chip side, and reference numeral 7 denotes a solder mask.

As shown in FIG. 2B, a solder pad of the chip and a solder pad of the PCB may have different sizes. Even though the solder pads have different sizes, the sizes must be similar to each other, that is, the difference between the sizes must be 30% or less. In FIGS. 2A and 2B, reference numerals 1 and 2 denote the same components as FIG. 1. Reference numeral 8 denotes a solder pad size.

When the solder pads have different sizes, solder bonds are mechanically weak, and electric signal transmission is not possible.

Further, when the difference between the sizes of the solder pads is very large, that is, 150% or more, all of the solder melts and bonds to a larger solder pad. Thus, bonding may not be successfully performed at a position where a smaller solder pad is provided.

Even if the difference between the sizes of the solder pads is small and bonding may be realized at both solder pads, a larger amount of molten solder is bonded to the larger solder pad. Thus, the conventional bonding method has a drawback in that it is impossible to maintain the distance between the chip and the PCB, which is preset at an initial design stage, so that the solder pads must be designed to have the same size for the purpose of a solder bonding operation which is executed between the chip and the PCB or the chips in the flip-chip package.

As such, when the solder pads are designed to have one size, the following problem occurs. That is, when a product having a solder pad of a different size may be produced, the product must be discarded, thus undesirably increasing manufacturing costs thereof.

Since a multi-layer design and a multi-layer process are usually conducted on the chip side, it is possible to make solder pads at various positions, in addition to increasing the size of the solder pads. In order to cause the size and positions of the solder pads of the PCB side to correspond to those of the solder pads of the chip side, the operation of manufacturing the PCB must be executed using the multi-layer design or the multi-layer process.

If the solder pads provided at the PCB side may be small, it is unnecessary to form wiring lines in multiple layers, and it is possible to form wiring lines without contacting the solder pads even in a single layer, thus reducing manufacturing costs of the PCB.

SUMMARY OF THE INVENTION

Accordingly, the present invention has been made keeping in mind the above problems occurring in the prior art, and an object of the present invention is to provide a solder pad bonding method, which applies two kinds of solders to solder pads having different sizes during a bonding operation, thus enhancing mechanical and electrical reliability.

At a side having a larger solder pad, general solder having a size which is 50% of the size of the solder pad is used, so that the solder is completely bonded to the solder pad. Meanwhile, at a side having a smaller solder pad, a solder ball having a core which is not melted even by a solder reflow process is bonded to the solder pad. Finally, the general solder is bonded to the solder ball having the core.

In order to accomplish the above object, the present invention provides a method of bonding solder pads of a flip-chip package, the solder pads having different sizes provided at a bonded part, the method including a larger solder pad treating step of bonding a general solder ball having no core to a side having a larger solder pad, a smaller solder pad treating step of bonding a solder ball having a core to a side having a smaller solder pad, and a step of bonding the larger solder pad to the smaller solder pad.

The solder pads are used to bond a chip and a PCB, a chip and a chip, or a PCB and a PCB.

The solder ball to be bonded to the side having the larger solder pad may be selected from the group consisting of lead free solder and lead solder. A solder bump formed through screen printing may be used in place of the solder ball.

A size of the solder ball provided on the side having the larger solder pad is 30~70% of a size of the solder pad.

The core held in the solder ball comprises at least one of polymer, ceramic and metal, which have a melting point higher than that of the solder ball.

The method includes the steps of reflowing the solder to bond the solder to the solder pad of a chip side, reflowing the solder ball having the core to bond the solder ball to the solder pad of a PCB side, and aligning, bonding, and reflowing bonded parts between the chip and the PCB, after flux of the solder pads is washed off and flux is applied to the solder and the solder ball bonded to the chip side and the PCB side.

At the smaller solder pad treating step, when the core provided on the side having the smaller solder pad does not have a spherical shape, a solder bump may be formed using lead solder paste or lead free solder paste through screen printing and reflowing.

The solder paste may contain nickel, polycarbonate, or polyimide which is not melted at a melting point of the solder, thus maintaining an interval between the chip and the PCB after the chip and the PCB have been bonded together.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be described in detail with reference to the attached drawings.

Figure 1:
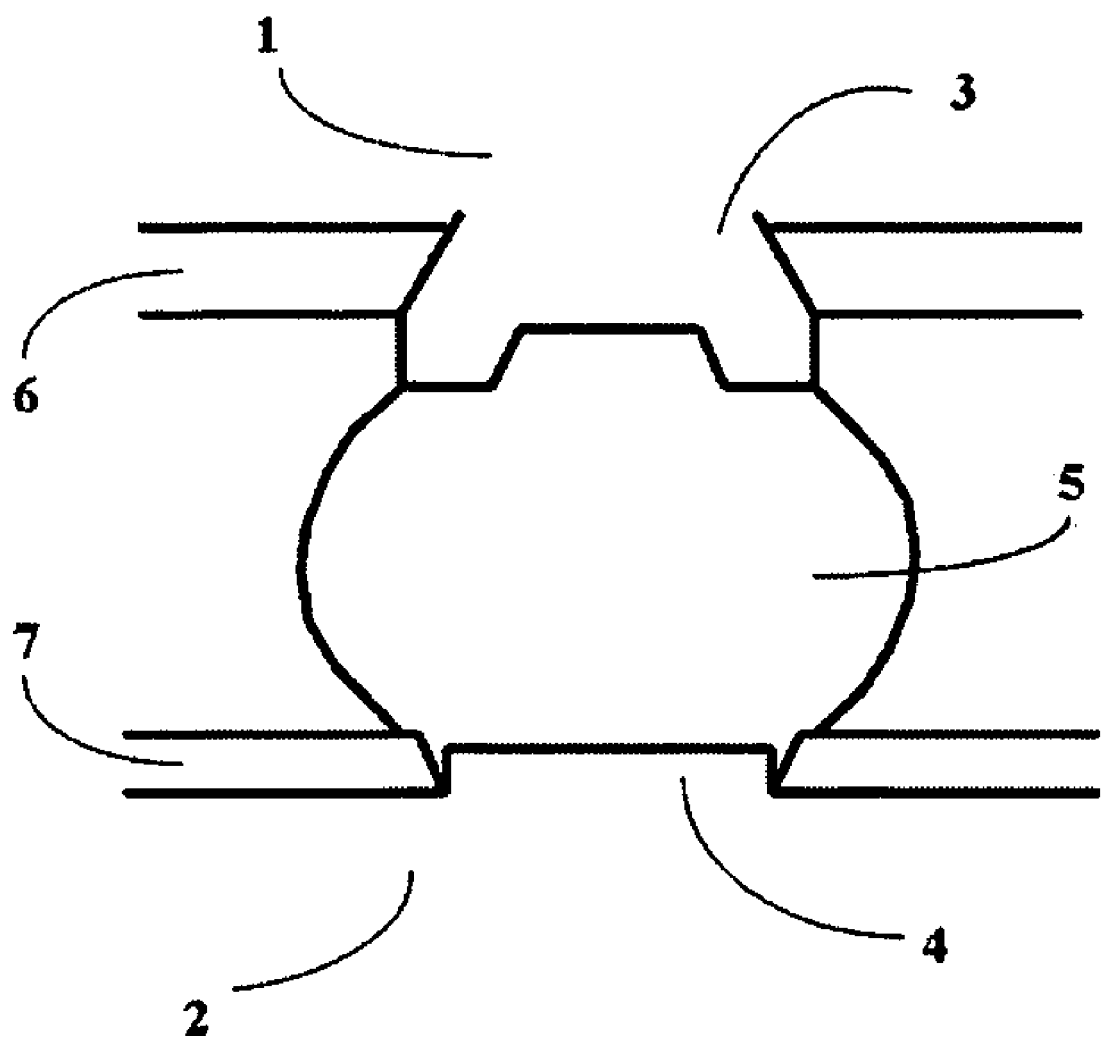
FIG. 1 is a sectional view of a solder bonded part between a general chip and a PCB in a flip-chip package.
Figure 2:
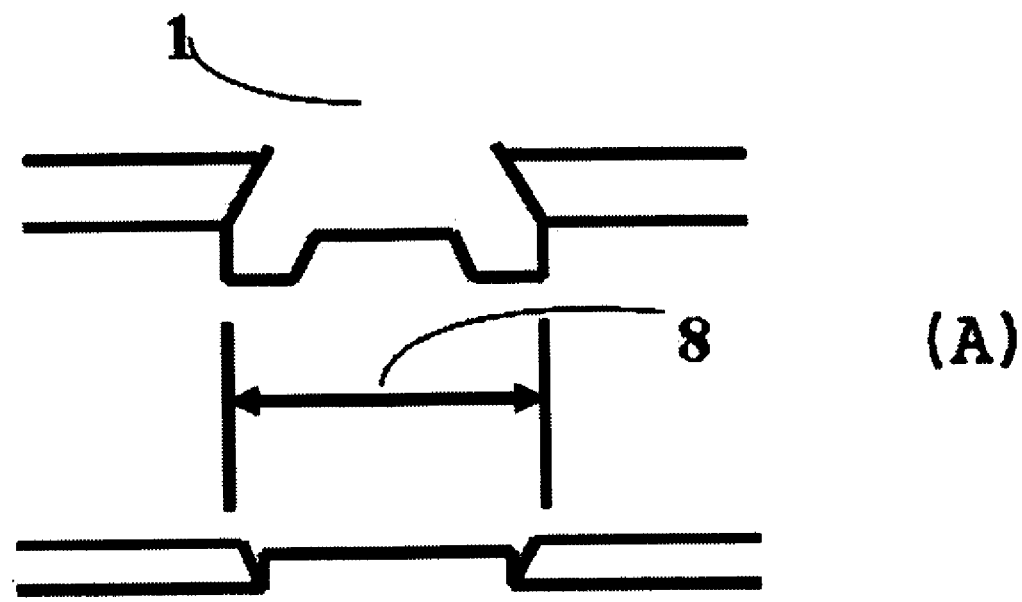
FIG. 2A is a view to show the case where solder pads provided at a bonded part have the same or similar size.
FIG. 2B is a view to show the case where solder pads provided at a bonded part have different sizes.
Figure 2:
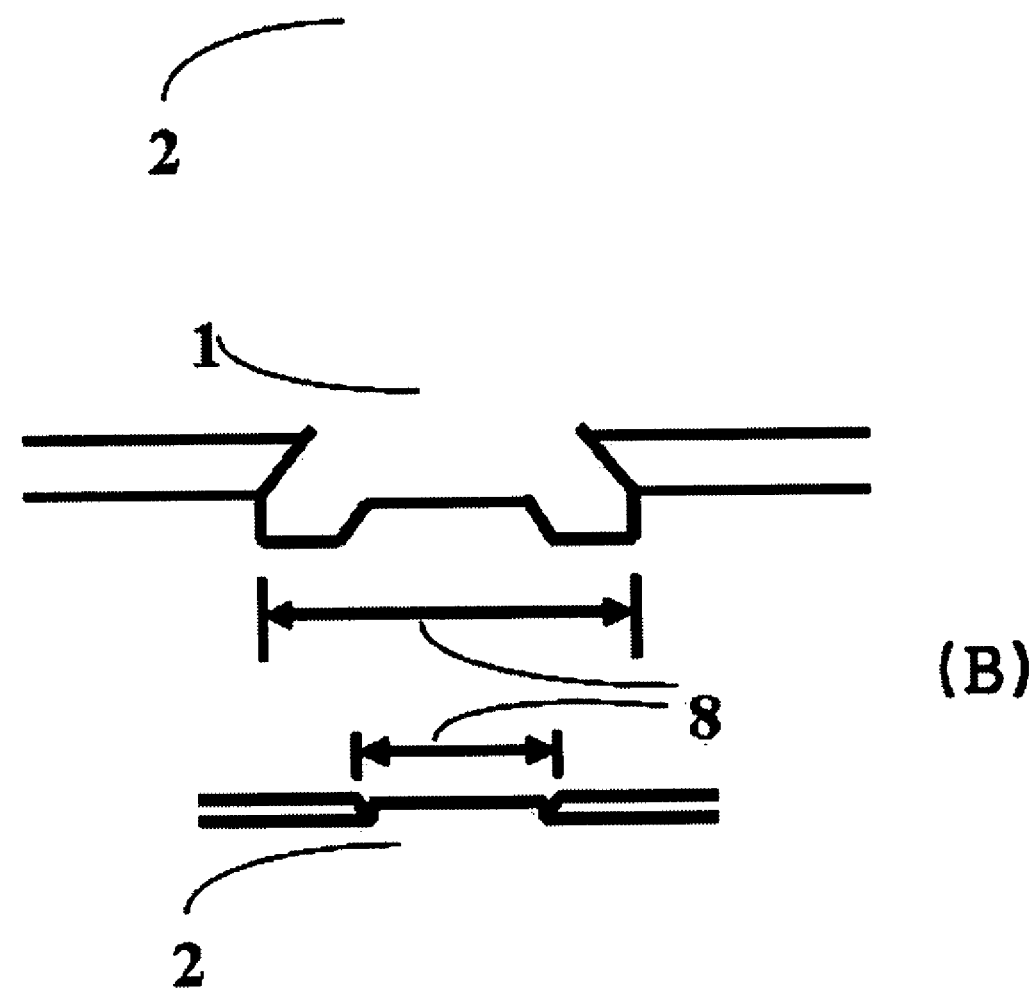

According to this invention, when a solder pad of a chip is larger than a solder pad of a PCB as shown in FIG. 2B, the following bonding process is carried out.

Figure 3:
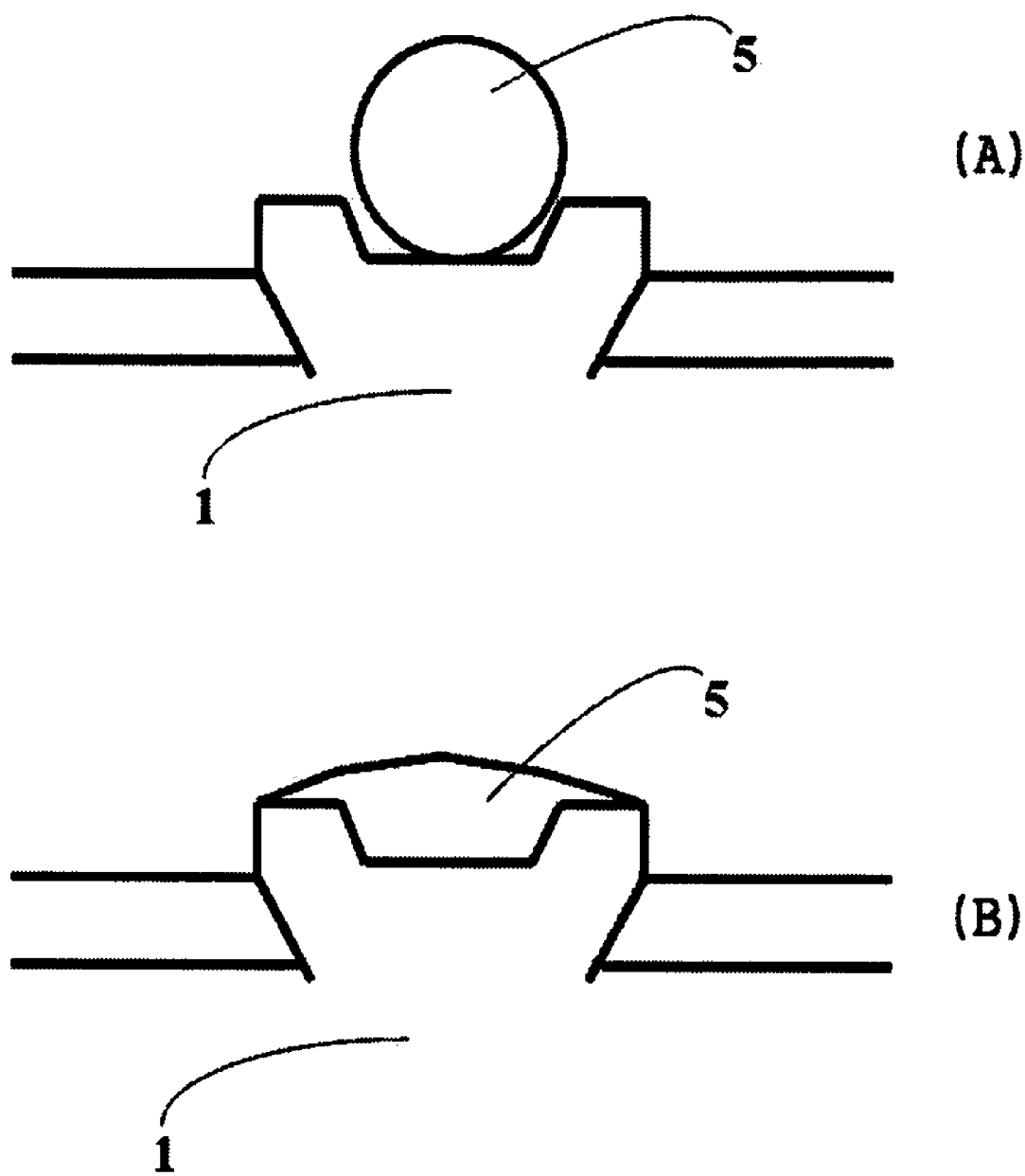
FIG. 3A is a view to show the state where solder is placed on a solder pad of a chip.
FIG. 3B is a view to show the state where the solder is reflowed to be bonded to the solder pad, after the process of FIG. 3A.

As shown in FIGS. 3A and 3B, flux is applied to a side having a larger solder pad so as to reliably bond solder to a metal wetting layer 3 of the solder pad. Next, as shown in FIG. 3A, solder smaller than the solder pad is placed on the solder pad. The solder used for the larger solder pad is general solder having no core. The general solder is made of lead free solder or lead solder, or may have the form of a solder ball or be formed through screen printing.

Further, the solder ball of the size corresponding to about 50% (the range from 30% to 70%) of the size of the solder pad is the most proper. When the solder is reflowed for 1 minute or so at a reflow temperature suitable for a used solder ball, that is, about 180~250° C., the solder is bonded to the solder pad of the chip side, as shown in FIG. 3B.

Figure 4:
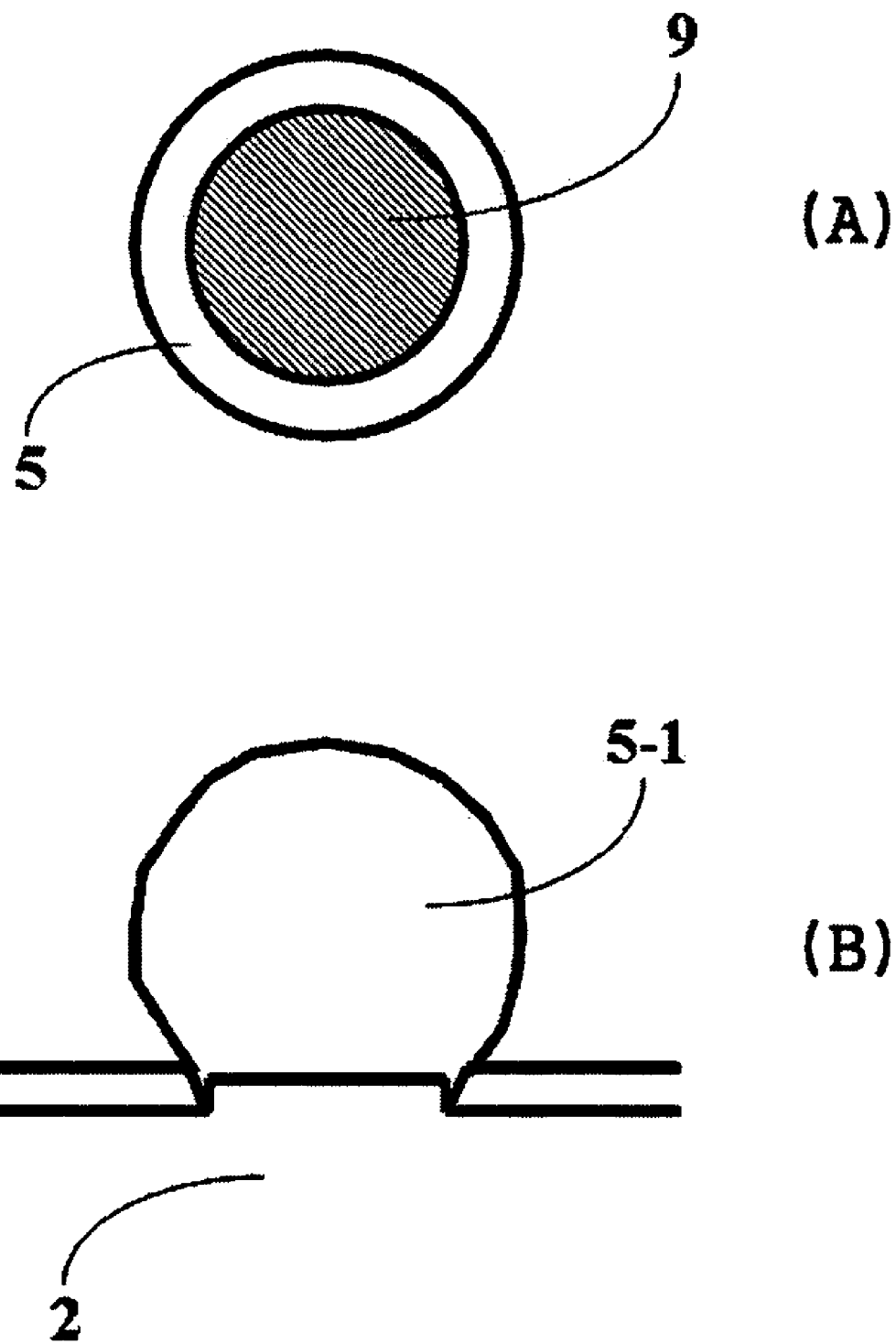
FIG. 4A is a sectional view of a solder ball having a core therein.
FIG. 4B is a view to show the state where the solder ball having the core is reflowed and bonded to a solder pad.

Meanwhile, at a PCB side having a smaller solder pad, a solder ball having a core is used, as shown in FIG. 4A.

In FIG. 4A, reference numeral 9 denotes the core.

The core 9 provided in the solder ball is made of a material having a melting point which is higher than that of the solder, such as polymer, ceramic, or metal. According to the distance between the chip and the PCB, which must be maintained after the chip has been bonded to the PCB, a suitable solder ball having the core is selected. The solder ball having the core is treated in the same manner as the process performed on the chip side, so that the solder ball is bonded to the solder pad of the PCB, as shown in FIG. 4B.

In FIG. 4B, reference numeral 5-1 denotes solder having a core.

After flux applied to the solder pad is washed off using clean water or a cleaner, the flux is applied to the solder bonded to the chip and the PCB. After a bonded part is aligned between the chip and the PCB, it is maintained for one or two minutes at a reflow temperature which is suitable for the solder used.

Figure 5:
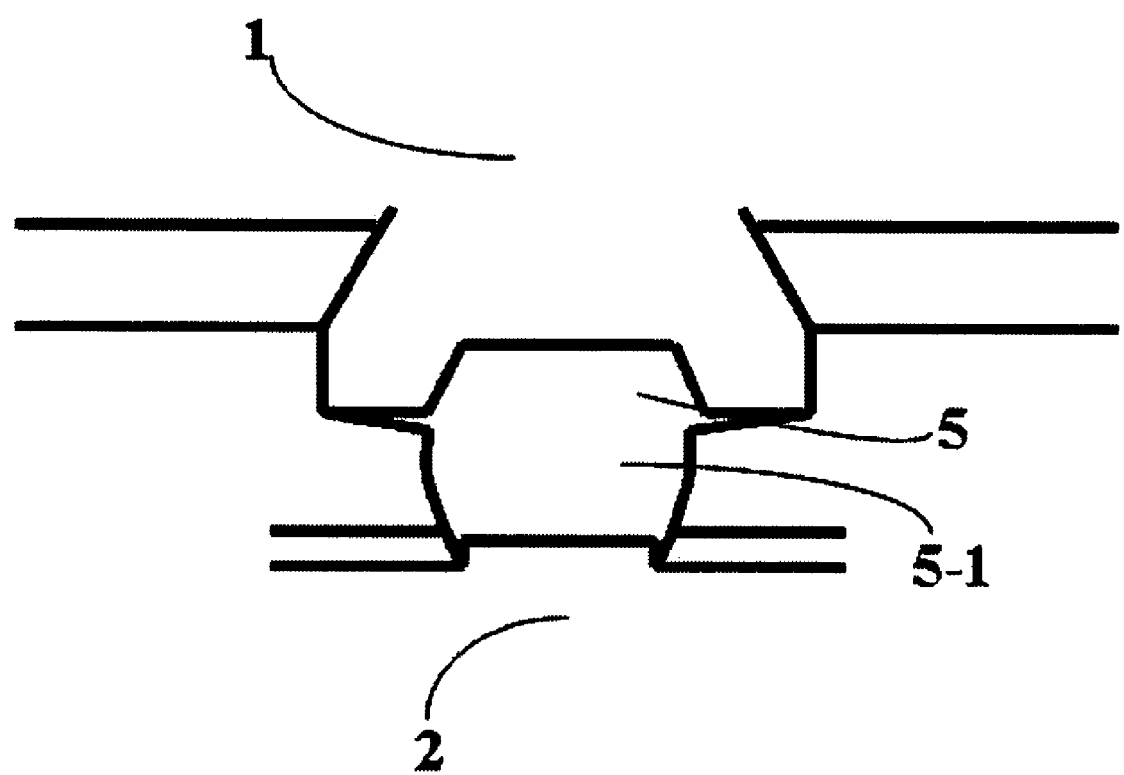
FIG. 5 is a view to show the state where a bonded part is formed using general solder having no core and a solder ball having a core, when the solder pads have different sizes.

Finally, the solder pads of the chip and the PCB are bonded as shown in FIG. 5, thus realizing a mechanically and electrically reliable bonding state. The flux is washed off again. Thereafter, a general flip-chip packaging process, such as an underfilling process, is executed as necessary.

The embodiments and test examples of this invention will be described in detail below. However, they are illustrative and the invention is not limited by the embodiments and test examples.

First Embodiment

A chip has a size of 12 mm×12 mm, and 80 solder pads each having a size of 600 µm, are arrayed along the periphery of the chip in two rows, thus forming a peripheral arrangement. Further, a PCB has a size of 50 mm×50 mm, and the size of a solder pad at a position where the chip is mounted is 250 µm.

In order to flip-chip package the chip on the PCB, flux is applied to each solder pad of the chip. Afterwards, a lead solder ball having a size of 350 µm is placed on the solder pad. In such a state, a reflow process is performed at the temperature of 245° C. for 2 minutes so that the lead solder ball is easily bonded to the solder pad of the chip.

Further, a lead solder ball, having a size of 300 µm and having a polymer core of 270 µm therein, is used on the PCB. Flux is applied to the solder pad of the PCB, in the same manner as the chip. Thereafter, the solder ball having the core is placed on the solder pad.

In such a state, a reflow process is performed at a temperature of 245° C. for 2 minutes so that the lead solder ball having the core is easily bonded to the solder pad of the PCB. Next, the flux remaining on the chip and the PCB is washed off, and a drying operation is carried out.

After flux is applied to the solder bonded to the chip and the PCB, the chip is aligned at a predetermined position on the PCB.

When the chip is aligned at the bonded position, the chip is placed on the PCB. Subsequently, the reflow process is executed at the temperature of 250° C. for 2 minutes. Next, the flux is washed off and the bonding state is tested using test equipment. Thereafter, an underfill between the chip and the PCB is applied.

Second Embodiment

A chip has a size of 10 mm×10 mm, and a solder pad of the chip has a size of 500 µm. A solder pad of a PCB on which the chip is flip-chip packaged has a size of 200 µm.

In order to flip-chip package the chip and the PCB, a solder bump is formed on the solder pad through screen printing. On a chip side having the larger solder pad, a solder bump is printed through screen printing using lead solder paste which is 250 µm in size and 200 µm in height. Subsequently, a reflow process is performed at the temperature of 230° C. for 1 minute. Thereby, the solder bump is formed.

Meanwhile, on a PCB side having the smaller solder pad, a solder bump is formed using lead solder paste which is 200 µm in size and 200 µm in height, in the same manner as the process which is performed on the chip side. However, the lead solder paste used on the PCB side must contain nickel particles which are 50 µm in size and have the shape of a hexahedron. The nickel particles must be uniformly distributed in the lead solder paste and are 30% of the lead solder paste by volume. The nickel particles contained in the solder paste of the PCB side are not melted at the reflow temperature which is 230° C., and serve to maintain the interval between the chip and the PCB, after the solder paste of the PCB side is reflowed and the chip is bonded to the PCB.

When the solder bump is formed on the pad of each of the chip and the PCB, the chip and the PCB are aligned again.

In such a state, another reflow process is carried out at the temperature of 230° C. for 2 minutes, so that the chip is bonded to the PCB.

An underfill is applied to the bonded package, thus finishing a flip-chip package.

Third Embodiment

When two chips each having a size of 8 mm×8 mm are layered and bonded, a pad of a chip constituting an upper layer has a size of 300 μm, and a pad of a chip constituting a lower layer has a size of 100 μm, solder bumps each having a width and height of 100 μm are formed on the upper and lower layers using lead solder paste through screen printing and a reflow process which is performed under conditions similar to those of the second embodiment.

In this case, the solder paste of the lower layer must contain 25% polycarbonate by volume, which has a particle size of 20 μm. The polycarbonate is not melted at the reflow temperature and maintains its shape, thus preventing the solder from being spread on the larger pad, therefore holding the chips at regular intervals.

After the chips are aligned, the reflow process is performed so as to bond the chips together.

As described above, when solder pads provided at a bonded position have different sizes, a conventional flip-chip process is carried out such that solder is bonded to a side and then a final bonding operation is performed using one kind of solder ball, so that bonding may not be performed on a side having a smaller pad, and solder may be spread on a side having a larger pad. This weakens the bonded part, and hinders the transmission of electric signals. In order to overcome the drawbacks, the pads must be manufactured or designed to have the same or similar size.

Unlike the prior art, the present invention enhances mechanical and electrical reliability. This invention allows solder pads provided on a chip or PCB to have different sizes, thus allowing new metallic signal lines to be designed, in addition to reducing manufacturing costs required for a multi-layer process.

Further, this invention permits the size difference of the solder pad, which is caused by errors during the design or process, thus reducing costs required for re-design or re-manufacturing operations of PCBs or the like.

What is claimed is:

1. A method of bonding solder pads of a flip-chip package, the solder pads having different sizes provided at a bonded part, the method comprising:

a larger solder pad treating step of bonding a general solder ball having no core to a side having a larger solder pad;

a smaller solder pad treating step of bonding a solder ball having a core to a side having a smaller solder pad; and a step of bonding the larger solder pad to the smaller solder pad.

2. The method according to claim 1, wherein the solder pads are selectively provided on a chip and a PCB, a chip and a chip, or a PCB and a PCB.

3. The method according to claim 1, wherein the solder ball to be bonded to the side having the larger solder pad is selected from the group consisting of lead free solder and lead solder.

4. The method according to claim 3, wherein a solder bump formed through screen printing is used in place of the solder ball.

5. The method according to claim 1, wherein a size of the solder ball provided on the side having the larger solder pad is 30~70% of a size of the solder pad.

6. The method according to claim 1, wherein the core held in the solder ball comprises at least one of polymer, ceramic and metal, which have a melting point higher than that of the solder ball.

7. The method according to claim 1, comprising the steps of:

reflowing the solder to bond the solder to the solder pad of a chip side;

reflowing the solder ball having the core to bond the solder ball to the solder pad of a PCB side; and aligning, bonding, and reflowing bonded parts between the chip and the PCB, after flux of the solder pads is washed off and flux is applied to the solder and the solder ball bonded to the chip side and the PCB side.

8. The method according to claim 1, wherein, at the smaller solder pad treating step, when the core provided on the side having the smaller solder pad does not have a spherical shape, a solder bump is formed using lead solder paste or lead free solder paste through screen printing and reflowing.

9. The method according to claim 8, wherein the solder paste contains nickel, polycarbonate, or polyimide which is not melted at a melting point of the solder, thus maintaining an interval between the chip and the PCB after the chip and the PCB have been bonded together.

* * * * *